(12) United States Patent
Iwai et al.

(10) Patent No.: US 10,672,593 B2
(45) Date of Patent: Jun. 2, 2020

(54) PLASMA PROCESSING APPARATUS AND PLASMA PROCESSING METHOD

(71) Applicant: Panasonic Intellectual Property Management Co., Ltd., Osaka (JP)

(72) Inventors: Tetsuhiro Iwai, Osaka (JP); Motoko Hara, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 237 days.

(21) Appl. No.: 15/795,368

(22) Filed: Oct. 27, 2017

(65) Prior Publication Data

US 2018/0130643 A1    May 10, 2018

(30) Foreign Application Priority Data

Nov. 9, 2016    (JP) .................................. 2016-218982

(51) Int. Cl.
  *H01J 37/32*    (2006.01)
  *H01L 21/687*    (2006.01)
  *H01L 21/3065*    (2006.01)

(52) U.S. Cl.
  CPC .. *H01J 37/32651* (2013.01); *H01J 37/32513* (2013.01); *H01J 37/32715* (2013.01); *H01J 37/32743* (2013.01); *H01L 21/68714* (2013.01); *H01J 2237/334* (2013.01); *H01J 2237/335* (2013.01); *H01L 21/3065* (2013.01)

(58) Field of Classification Search
  CPC ............... H01L 21/687; H01L 21/6831; H01L 21/6832; H01L 21/68714; H01L 21/68721; H01L 21/68728; H01L 21/3065
  See application file for complete search history.

(56) References Cited

U.S. PATENT DOCUMENTS 5,267,607 A * 12/1993 Wada .................. H01J 37/3244
                                                                165/80.1
5,423,918 A *  6/1995 Gupta ................. C23C 16/4401
                                                                134/1

(Continued)

FOREIGN PATENT DOCUMENTS

JP    H10-012599 A    1/1998
JP    2006-253365 A    9/2006

(Continued)

OTHER PUBLICATIONS

Machine Translation for JP2013134885. Retrieved by Espacenet https://worldwide.espacenet.com/ (Year: 2019).*

*Primary Examiner* — Tyrone V Hall, Jr.
(74) *Attorney, Agent, or Firm* — Pearne & Gordon LLP

(57) ABSTRACT

A plasma processing apparatus includes: a base that has an electrode body provided with a placing surface on which a substrate is placed and a pedestal which supports the electrode body; a lid that is liftable and lowerable with respect to the base and forms a sealed space for performing plasma processing on the substrate placed on the placing surface by being lowered to come into close contact with the pedestal; a cover that is provided integrally with the lid and covers at least a part of an outer edge of the substrate placed on the placing surface when the sealed space is formed; and a guide that is disposed around the electrode body.

17 Claims, 8 Drawing Sheets

(56) References Cited

U.S. PATENT DOCUMENTS

| | | | | |
|---|---|---|---|---|
| 5,573,596 A | * | 11/1996 | Yin | H01J 37/32532 |
| | | | | 118/723 E |
| 5,740,009 A | * | 4/1998 | Pu | H01L 21/6831 |
| | | | | 361/234 |
| 5,748,434 A | * | 5/1998 | Rossman | H01L 21/6831 |
| | | | | 361/234 |
| 6,238,513 B1 | * | 5/2001 | Arnold | H01J 37/32642 |
| | | | | 156/345.54 |
| 6,284,093 B1 | * | 9/2001 | Ke | H01J 37/32623 |
| | | | | 156/345.51 |
| 9,490,166 B2 | * | 11/2016 | Rieschl | C23C 14/50 |
| 10,283,381 B2 | * | 5/2019 | Ragunathan | H01J 37/32715 |
| 2008/0149596 A1 | * | 6/2008 | Dhindsa | H01J 37/3244 |
| | | | | 216/67 |
| 2009/0311088 A1 | | 12/2009 | Fazio | |
| 2010/0216313 A1 | * | 8/2010 | Iwai | H01J 37/32623 |
| | | | | 438/729 |
| 2011/0244690 A1 | * | 10/2011 | Shanker | C23C 16/44 |
| | | | | 438/703 |
| 2012/0247678 A1 | * | 10/2012 | Takahashi | H01J 37/32009 |
| | | | | 156/345.44 |
| 2012/0279946 A1 | | 11/2012 | Fazio | |
| 2013/0220545 A1 | * | 8/2013 | Koizumi | H01L 21/67103 |
| | | | | 156/345.27 |
| 2018/0114690 A1 | * | 4/2018 | Nishikawa | H01L 21/31 |
| 2019/0006220 A1 | * | 1/2019 | Chiu | H01L 21/6833 |

FOREIGN PATENT DOCUMENTS

| | | | |
|---|---|---|---|
| JP | 2009-071210 A | | 4/2009 |
| JP | 2010-502016 A | | 1/2010 |
| JP | 2013134885 A | * | 7/2013 |
| JP | 2013-239594 A | | 11/2013 |
| JP | 2015012045 A | * | 1/2015 |

* cited by examiner

PLASMA PROCESSING APPARATUS AND PLASMA PROCESSING METHOD

BACKGROUND

1. Technical Field

The present disclosure relates to a plasma processing apparatus and a plasma processing method by which cleaning or etching with plasma is performed on a substrate.

2. Description of the Related Art

In general, a plasma processing apparatus includes a base having a box-shaped lid and an electrode body. The lid is liftable and lowerable, and the lid is lowered after a target object (substrate) of plasma processing is placed onto the electrode body. Then, the lid and the base come into close contact with each other, thereby forming a sealed space. The sealed space is subjected to pressure reduction and is supplied with process gas, the electrode body is applied with high-frequency power, and thereby plasma is generated in the sealed space. In this manner, the substrate placed on the electrode body is subjected to plasma processing.

As a method of placing a substrate onto an electrode body, PCT Japanese Translation Patent Publication No. 2010-502016 discloses a method of transporting, a workpiece (substrate) onto the electrode body while an end effector fitted in an articulated arm of a robot supports the workpiece. In this case, the workpiece is temporarily delivered from the end effector to a workpiece ring that is liftable and lowerable above the electrode body. The workpiece ring is provided with a central opening and a rim surrounding the central opening, and the rim supports the workpiece. In addition, the workpiece ring is attached to a lifting/lowering plate provided to be liftable and lowerable with respect to the electrode body. The lifting/lowering plate is pressed by a pressing device installed on a lid, is linked with the lifting and lowering of the lid, and is liftable and lowerable with respect to the electrode body. The electrode body is provided with a projecting portion referred to as a base bottom portion, and the workpiece ring is disposed on the electrode body such that the central opening surrounds the base bottom portion when the lifting/lowering plate is lowered. In this manner, the workpiece is placed on the top of the base bottom portion from the workpiece ring.

SUMMARY

According to an aspect of the disclosure, a plasma processing apparatus includes: a base that has an electrode body provided with a placing surface on which a substrate is placed and a pedestal which supports the electrode body; a lid that is liftable and lowerable with respect to the base and forms a sealed space for performing plasma processing on the substrate placed on the placing surface by being lowered to come into close contact with the pedestal; a cover that is provided integrally with the lid and covers at least a part of an outer edge of the substrate placed on the placing surface when the sealed space is formed; and a guide that is disposed around the electrode body and is provided with a first main surface which is opposite to the lid, a second main surface which is opposite to the pedestal, and a guide surface which faces a side surface of the electrode body. When the sealed space is formed, the cover abuts on the first main surface and at least one of the cover and the guide surface is opposite to a side surface of the substrate. When the sealed space is not formed, the cover and the first main surface are separated from each other and at least a part of the guide surface protrudes from the placing surface toward a side of the lid.

According to another aspect of the disclosure, there is provided a plasma processing method of performing plasma processing on a substrate placed on a placing surface by generating plasma in a sealed space formed when a base that has an electrode body provided with the placing surface, on which the substrate is placed, and a pedestal, which supports the electrode body, is brought into close contact with a lid that is liftable and lowerable with respect to the base. The plasma processing method includes: a loading step of loading the substrate to a position that is separated from the placing surface and is opposite to the placing surface; a placing step of placing the loaded substrate on the placing surface along a guide that is disposed around the electrode body; and a sealing step of forming the sealed space by lowering the lid after the placing step. In the sealing step, the sealed space is formed, a cover provided integrally with the lid covers at least a part of an outer edge of the substrate placed on the placing surface, and at least one of the guide and the cover regulates the position of the substrate.

In the plasma processing apparatus according to the disclosure, an operation (step) of lowering the lid causes the cover to cover the outer edge of the substrate. Simultaneously, the position of the substrate is regulated. In other words, since the position of the substrate is regulated during the plasma processing, the outer edge of the substrate is reliably covered with the cover such that an effect of reducing damage to the outer edge of the substrate due to abnormal discharge is enhanced. Further, the plasma processing is also performed with improved accuracy. Accordingly, both of productivity and yield are improved.

DETAILED DESCRIPTION

Figure 1:
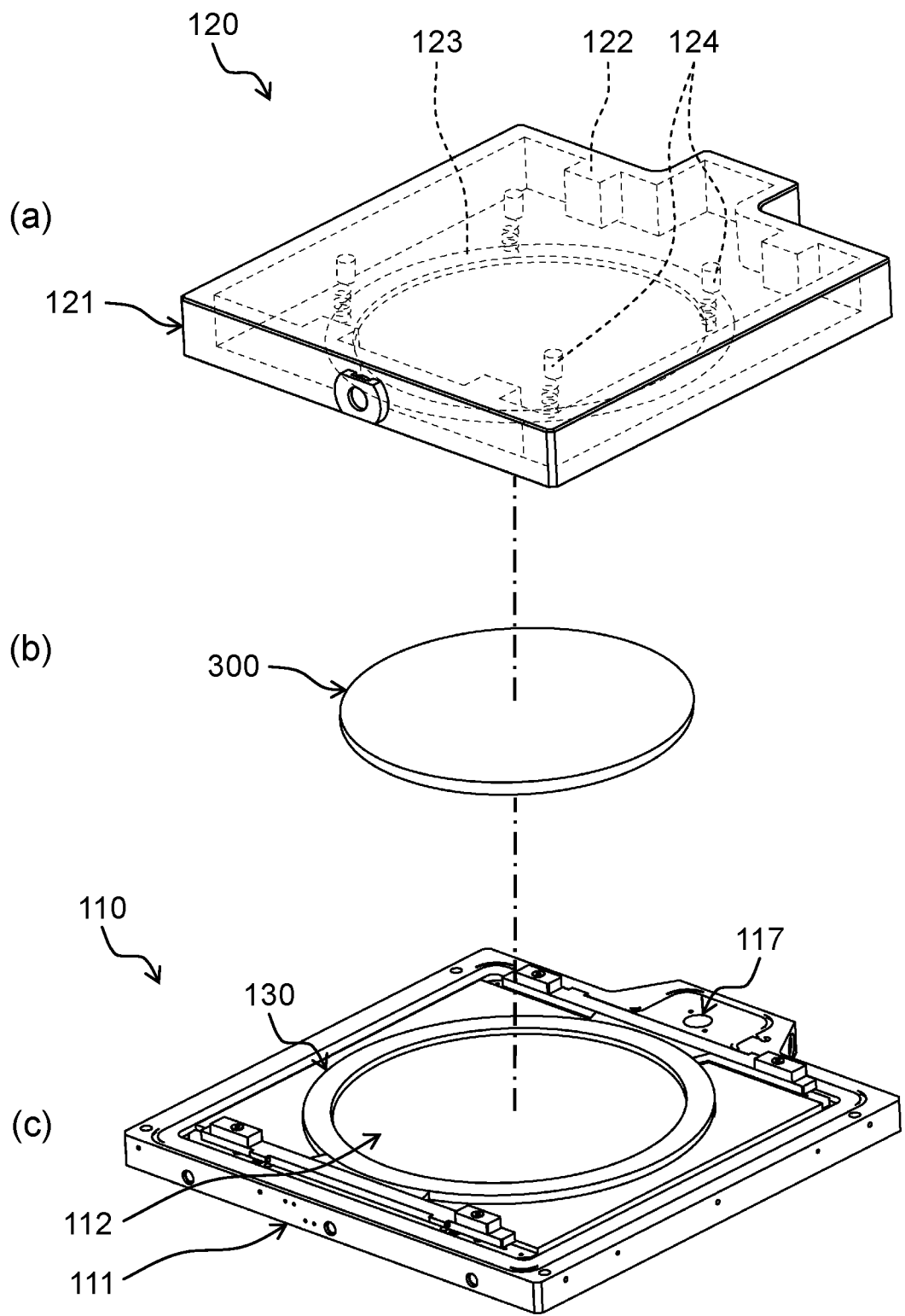
FIG. 1 is a perspective view schematically illustrating each of a lid, a base and, further, a substrate of a plasma processing apparatus according to an exemplary embodiment of the disclosure.

Before an exemplary embodiment is described, a problem in the related art is briefly described.

In PCT Japanese Translation Patent Publication No. 2010-502016, a base bottom portion has a diameter that is substantially equal to a diameter of a central opening of a workpiece ring. In other words, the base bottom portion has the diameter that is smaller than that of a workpiece. Therefore, the workpiece is placed in a state in which the outer edge of the workpiece protrudes from the base bottom portion, and the workpiece is subjected to plasma processing. In this case, since abnormal discharge is likely to occur in the vicinity of an outer edge portion of a substrate which protrudes from the base bottom portion, during plasma processing, the substrate may be damaged.

Next, exemplary embodiments of the disclosure will be described with reference to the figures.

A plasma processing apparatus according to the disclosure includes a lid and a base that has an electrode body provided with a placing surface on which a substrate is placed and a pedestal which supports the electrode body. The lid is liftable and lowerable with respect to the base and is lowered to come into close contact with the pedestal, and thereby a sealed space is formed. Plasma is generated in the sealed space, and thus plasma processing is performed on the substrate placed on the placing surface.

The plasma processing apparatus further includes a cover that is capable of covering at least a part of an outer edge of the substrate. The cover is provided integrally with the lid, and thus the cover is also lowered when the lid is lowered. In other words, through an operation of lowering the lid and forming the sealed space, at least a part of the outer edge of the substrate placed on the placing surface is covered with the cover so as to be protected from plasma. In this manner, since abnormal discharge is unlikely to occur on the outer edge of the substrate, and damage to the substrate is reduced, productivity and yield are improved.

The plasma processing apparatus further includes a guide that regulates the position of the substrate when the substrate is placed on the placing surface. In this manner, the substrate is placed at a predetermined position of the placing surface with high accuracy. The guide is disposed around the electrode body and is provided with a first main surface which is opposite to the lid, a second main surface which is opposite to the pedestal, and a guide surface which faces a side surface of the electrode body. At least when the sealed space is not formed, at least a part of the guide surface protrudes from the placing surface of the electrode body toward a side of the lid. Therefore, the substrate is placed on the placing surface along the protruding guide surface.

When the sealed space is formed, the cover abuts on the first main surface of the guide. At this time, the cover may come into contact with the substrate or may not come into contact with the substrate. In a case where the cover does not come into contact with the substrate, the cover is lowered to a position close to the substrate to the extent that it is possible to protect the outer edge of the substrate from plasma. Therefore, regardless of the contact between the cover and the substrate, through the operation of lowering the lid and forming the sealed space, the position of the substrate in a direction (thickness direction of the substrate) perpendicular to the placing surface is regulated by the cover.

In addition, when the sealed space is formed, the side surface of the substrate, the cover, and the guide are not in contact with each other. However, a part of the cover and/or at least a part of the guide surface are opposite to the side surface of the substrate. In other words, through the operation of lowering the lid and forming the sealed space, the position of the substrate in a direction horizontal to the placing surface is regulated by the cover and/or the guide.

In other words, the substrate placed on the placing surface while being positioned by the guide with high accuracy is subjected to position regulation in directions horizontal and perpendicular to the placing surface by the guide and/or the cover through the operation of forming the sealed space. Therefore, during plasma processing, it is possible to reliably protect the outer edge of the substrate with the cover. As a result, in a state of reducing damage to the substrate, plasma processing is performed with high accuracy. When the sealed space is not formed, the cover and the first main surface are separated from each other. However, the position regulation of the substrate is maintained in the direction horizontal to the placing surface by the guide surface protruding from the placing surface toward the side of the lid. In addition, when the substrate and the placing surface are charged due to the plasma processing, the repulsive force due to the Coulomb force is generated between the substrate and the placing surface, and the substrate may float from the placing surface. In this case, a force of causing the substrate to sideslip is likely to be generated due to an influence of gravity or the like. However, even when the sealed space is not formed, the guide surface protrudes from the placing surface toward the side of the lid, and thus the sideslipping of the substrate is reduced. Accordingly, a transport error is unlikely to occur when the substrate is transported.

First Exemplary Embodiment

Hereinafter, a plasma processing apparatus according to a first exemplary embodiment will be specifically described with reference to FIGS. 1 and 2.

FIG. 1 is a perspective view schematically illustrating each of lid 120 and base 110 and, further, substrate 300 of plasma processing apparatus 100. (a) of FIG. 1 illustrates lid 120, (b) of FIG. 1 illustrates substrate 300, and (c) of FIG. 1 illustrates base 110. FIG. 2 is a sectional view schematically illustrating plasma processing apparatus 100 in a state in which the sealed space is formed.

Plasma processing apparatus 100 includes base 110 and lid 120. Lid 120 has a box shape having a ceiling portion and side walls extending from the periphery of the ceiling portion, end surfaces of the side walls of lid 120 and a rim (pedestal 111) of base 110 come into close contact with each other, and thereby a box-shaped chamber is formed inside.

Base 110 includes electrode body 112 on a surface that is opposite to lid 120. Electrode body 112 is connected to power supply 400. Electrode body 112 is applied with high-frequency power from power supply 400 in process gas atmosphere, and thereby plasma is generated in the chamber. Lid 120 functions as a counter electrode of electrode body 112 included in base 110. For example, power supply 400 is configured to include high-frequency power supply 401 and automatic matching box 402. Automatic matching box 402 has an effect of preventing interference with power transfer due to the reflected power of high-frequency power applied between electrode body 112 and lid 120.

It is possible to maintain pressure reduction atmosphere in the chamber via exhaust port 117 that communicates with the chamber. The exhaust port 117 communicates with a vacuum-suction unit not illustrated. The vacuum-suction unit is configured to have a vacuum pump, exhaust piping, a pressure regulating valve, or the like. Seal member 116 is provided on the surface of pedestal 111 on which lid 120 abuts, and thus sealing properties of the chamber are increased. Although not illustrated, plasma processing apparatus 100 includes a gas supplier for guiding process gas which is a plasma source into the chamber. The gas supplier is configured to include a gas cylinder that supplies the process gas such as argon, oxygen, or nitrogen, piping of guiding the process gas into the chamber, or the like.

Figure 8A:
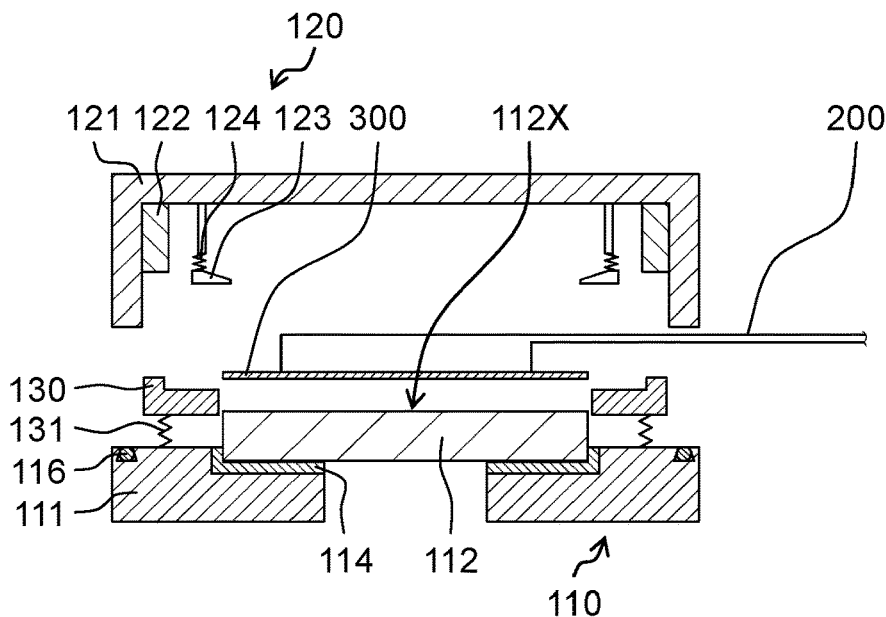
FIG. 8A is a sectional view schematically illustrating a plasma processing apparatus in each of processes of a plasma processing method according to an exemplary embodiment of the disclosure.
Figure 8B:
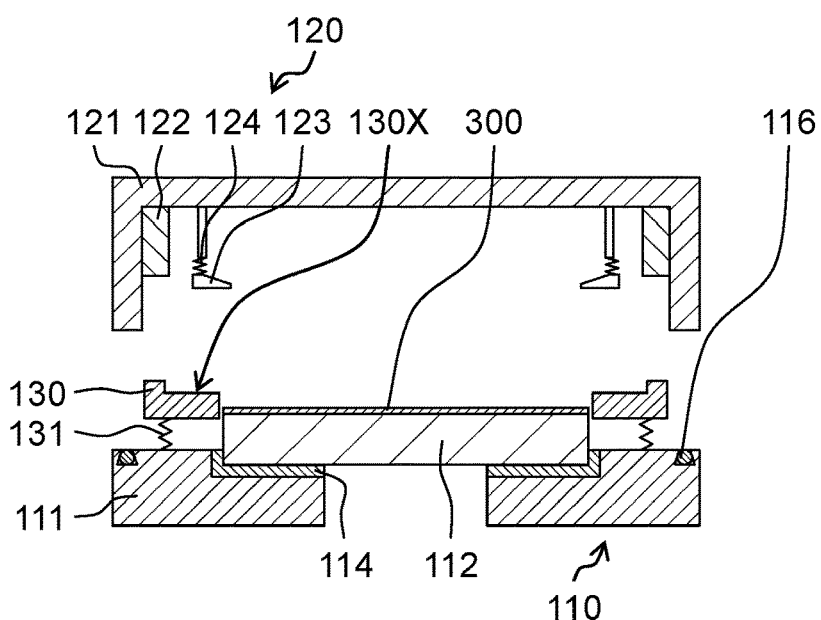
FIG. 8B is a sectional view schematically illustrating the plasma processing apparatus in each of the processes of the plasma processing method according to the exemplary embodiment of the disclosure.

When substrate 300 is loaded into the chamber and is unloaded from the chamber, lid 120 is separated from base 110, and the chamber is opened (refer to FIGS. 8A and 8B). On the other hand, when the plasma processing is performed on substrate 300, lid 120 and pedestal 111 are brought into close contact with each other, and the chamber is closed (refer to FIG. 8C). The opening and closing of the chamber are performed by lifting and lowering lid 120. The lifting and lowering of lid 120 is controlled by a predetermined drive source not illustrated.

Electrode body 112 is supported on pedestal 111 via insulation member 114. Electrode body 112 is made of a conductive material (conductor), and is provided with placing surface 112X on which substrate 300 is placed. Electrode body 112 has a side surface which is covered with insulation member (not illustrated) along the entire circumference thereof and is insulated from guide 130. Electrode body 112 may be a stacked body of a plurality of electrode bodies.

Lid 120 has a main body portion (lid main body 121) that is provided integrally with cover 123. When the sealed space is formed, cover 123 is a member that is capable of covering at least a part of the outer edge of substrate 300 placed on placing surface 112X. In a state in which cover 123 covers at least a part of the outer edge of substrate 300, the plasma processing is performed. Accordingly, abnormal discharge which is likely to occur on the outer edge of substrate 300 is reduced.

As described above, cover 123 is provided integrally with lid 120. Therefore, through the operation of lowering lid 120 for forming the sealed space, it is possible to cover the outer edge of substrate 300. At this time, cover 123 abuts on first main surface 130X of guide 130 which is opposite to lid 120.

It is preferable that plasma processing apparatus 100 includes first biasing part 124 that connects cover 123 and lid main body 121 to each other. It is preferable that cover 123 is connected to lid main body 121 via first biasing part 124. In this case, the bias force of first biasing part 124 acts in a direction in which first main surface 130X of guide 130 is pressed down.

There is no particular limitation to first biasing part 124, and an example of the first biasing part includes a spring. There is no particular limitation to the number and arrangement of first biasing part 124, and the number and arrangement thereof may be set according to a shape or the like of cover 123. In a case where cover 123 has a frame-shaped body corresponding to the outer edge of substrate 300 as illustrated in an example, it is preferable that a plurality of first biasing part 124 are arranged at equal intervals.

When the sealed space is formed, cover 123 may be in contact with the entirety or a part of the circumference of the outer edge of substrate 300 or may not be in contact with the outer edge of substrate 300. In a case where cover 123 and the entirety or a part of the circumference of the outer edge of substrate 300 are in contact with each other, warpage of substrate 300 can be corrected by cover 123. On the other hand, in a case where cover 123 and the outer edge of substrate 300 are not in contact with each other, heat of cover 123 is unlikely to be transmitted to substrate 300, and thus extension or degradation of substrate 300 due to the heat is reduced. Since cover 123 is exposed to plasma, the cover is heated in some cases. In addition, it is preferable that cover 123 and the outer edge of substrate 300 are not in contact with each other in that damage (cracks or the like) due to the contact of substrate 300 with cover 123 is reduced even in a case where substrate 300 is heated and extends due to plasma. It is preferable that the shortest distance between cover 123 and the outer edge of substrate 300 is 5 mm or shorter in that an effect of protecting the outer edge of substrate 300 from plasma is increased.

There is no particular limitation to the shape of cover 123, it is preferable that the cover has a shape (for example, a frame shape as illustrated in FIG. 1) corresponding to the outer edge of substrate 300 in that it is possible to effectively cover the outer edge of substrate 300. In this case, cover 123 covers the entire circumference of the outer edge of substrate 300.

Guide 130 is disposed around electrode body 112. Guide 130 is used for positioning substrate 300 placed on placing surface 112X and is provided with first main surface 130X which is opposite to lid 120, second main surface 130Y which is opposite to pedestal 111, and guide surface 130Z which faces the side surface of electrode body 112. At least when the sealed space is not formed, guide surface 130Z protrudes from placing surface 112X toward a side of lid 120. Therefore, when substrate 300 is placed on placing surface 112X, it is possible to place substrate 300 on placing surface 112X along protruding guide surface 130Z. Accordingly, substrate 300 is placed at a predetermined position on placing surface 112X with high accuracy. In this manner, since cover 123 reliably protects the outer edge of substrate 300, abnormal discharge is reduced on the outer edge of substrate 300, and an effect of reducing damage to substrate 300 is enhanced. Further, since the position of substrate 300 is determined, accuracy of the plasma processing is also increased. When guide surface 130Z faces the side surface of electrode body 112, it means that at least a part of a trajectory of guide surface 130Z, which is drawn when guide 130 moves in a normal direction of placing surface 112X, is opposite to the side surface of electrode body 112.

The shorter the distance between the side surface of substrate 300 (or side surface of electrode body 112) placed on placing surface 112X and guide surface 130Z (or first guide portion 130Za to be described below), the more preferable, from a viewpoint of improvement in accuracy of positioning. For example, the distance is substantially several millimeters. There is no particular limitation to the shape of guide 130, and it is preferable that the guide has a shape surrounding the entire circumference of the outer edge of placing surface 112X from a viewpoint of improvement in accuracy of positioning.

It is preferable that guide 130 is liftable and lowerable with respect to electrode body 112. In this case, a state in which first main surface 130X of guide 130 protrudes from placing surface 112X toward the side of lid 120 (for example, a state in which no load is applied to second biasing part 131 to be described below) means that guide 130 is disposed at a lifted position. A state in which first main surface 130X of guide 130 is closer to a side of base 110 than to the lifted position (for example, a state in which a load is applied to second biasing part 131 to be described below) means that guide 130 is disposed at a lowered position.

The lifting and lowering of guide 130 is performed by second biasing part 131 which is interposed between guide 130 and pedestal 111. In this case, lid 120 is provided integrally with linkage 122 that pushes down guide 130 from the lifted position to the lowered position. In this manner, when the sealed space is formed, guide 130 is pushed down to the lowered position by linkage 122. Therefore, an unnecessary gap is unlikely formed between guide 130 and substrate 300, and the abnormal discharge is likely to be reduced. As described above, linkage 122 is provided integrally with lid 120, and thereby, through an operation of lowering lid 120, lowering of guide 130 is achieved as well as lowering of cover 123. For example, linkage 122 is a projecting member installed on an inner wall surface of lid 120. There is no particular limitation to the shape of the projecting member.

There is no particular limitation to the lowered position of guide 130, and it is preferable that the lowered position is a position at which a main surface of substrate 300 on the side of lid 120 is flush with first main surface 130X of guide 130 in that the unnecessary gap is unlikely to be formed. In addition, the lowered position of guide 130 is a position at which guide surface 130Z is opposite to the side surface of substrate 300, and thereby a position of substrate 300 in the direction horizontal to placing surface 112X is regulated such that a position shift of substrate 300 is reduced.

There is no particular limitation to second biasing part 131, and an example thereof includes a spring. There is no particular limitation to the number and arrangement of second biasing part 131, and the number and arrangement thereof may be set according to a shape or the like of guide 130. In a case where guide 130 has a frame body surrounding the entire circumference of the outer edge of placing surface 112X as illustrated in an example, it is preferable that a plurality of second biasing part 131 are arranged at equal intervals.

It is desirable that the bias force of second biasing part 131 to guide 130 is larger than the bias force of first biasing part 124 to cover 123. This is because a sufficient reaction force is required for causing guide 130 to move to the lifted position against own weight of the guide, whereas own weight of cover 123 acts on the cover. In addition, since cover 123 is disposed to protect (shield) the outer edge of substrate 300 from plasma, the cover does not need to press down substrate 300 with force more than necessary. Further, in a case where an obstacle is placed at the lowered position of cover 123 because of a problem or the like of transport, cover 123 is required to be easily pressed upward, from a viewpoint of prevention of breakage of cover 123. Also from this viewpoint, it is desirable that the bias force of second biasing part 131 to guide 130 is larger than the bias force of first biasing part 124 to cover 123.

There is no particular limitation to materials of members that configure plasma processing apparatus 100. In general, members such as pedestal 111 and linkage 122 which are exposed to plasma during the plasma processing are made of a conductive material (conductor) such as aluminum or stainless steel according to reasons of achieving strength, light weight, processibility, and the like. The members formed of such conductors may have a surface subjected to insulation processing (for example, hard alumite processing). First biasing part 124 and second biasing part 131 are both made of such a conductor. Cover 123 and guide 130 are made of such a conductor, or a ceramic material such as alumina, silica, silicon nitride, or aluminum nitride, according to reasons of achieving strength, plasma resistance, and the like.

Figure 2:
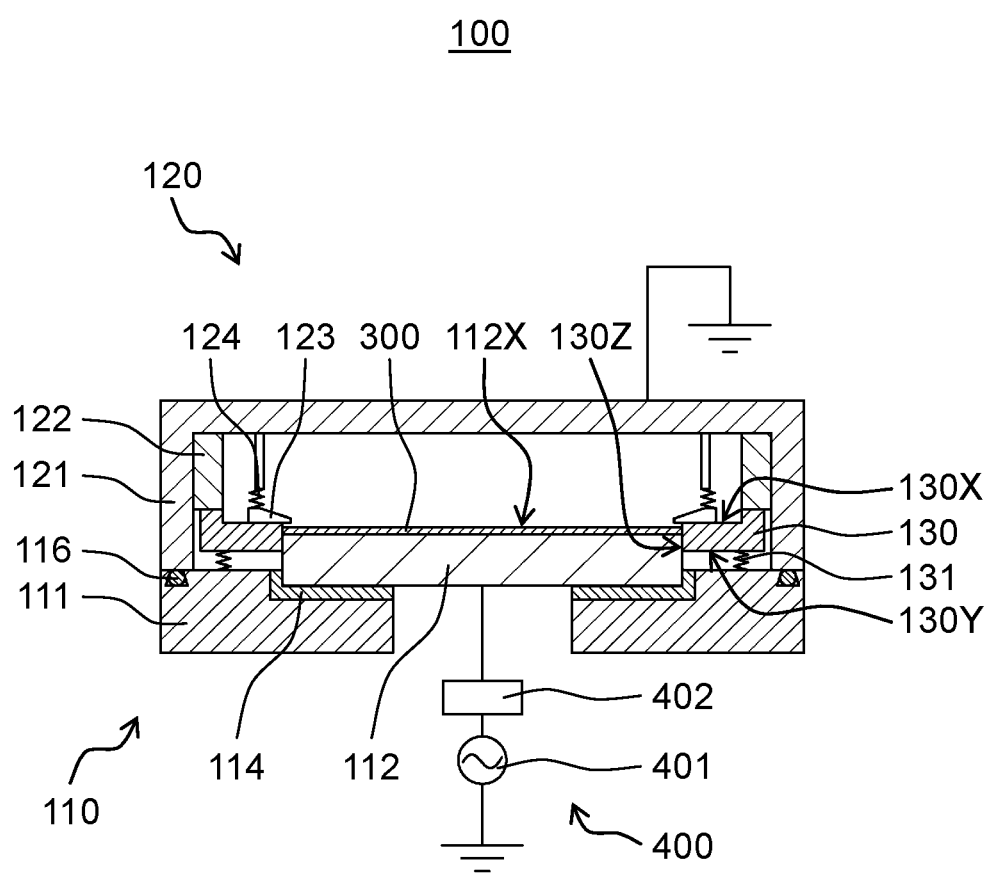
FIG. 2 is a sectional view schematically illustrating the plasma processing apparatus in a state in which a sealed space is formed, according to the exemplary embodiment of the disclosure.

Cross-sectional shapes of cover 123 and guide 130 are not limited to the shapes in FIG. 2 and may be appropriately modified, depending on a material, a thickness, or the like of the substrate. For example, a surface of cover 123 which is opposite to first main surface 130X of guide 130 may be provided with a protrusion. Otherwise, guide 130 provided with step-shaped guide surface 130Z may be used. For example, guide 130 may be particularly preferably used when substrate 300 that easily extends due to heat is subjected to the plasma processing.

Hereinafter, a modification example (second exemplary embodiment) of cover 123 and modification examples (third to sixth exemplary embodiments) of guide 130 will be described with reference to the figures. The following exemplary embodiments are used in a case where guide 130 is liftable and lowerable with respect to electrode body 112.

Second Exemplary Embodiment

Figure 3A:
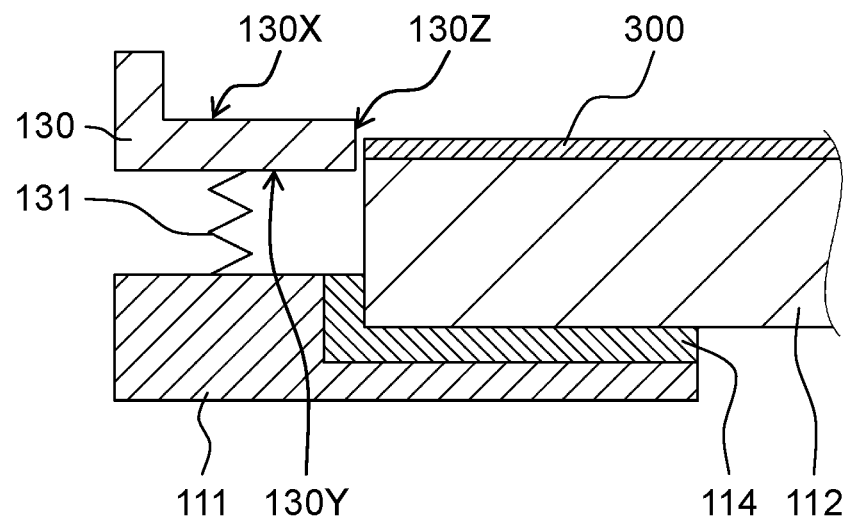
FIG. 3A is a sectional view schematically illustrating a part of a plasma processing apparatus in the vicinity of a guide (in a case where the guide is disposed at a lifted position), according to a second exemplary embodiment of the disclosure.
Figure 3B:
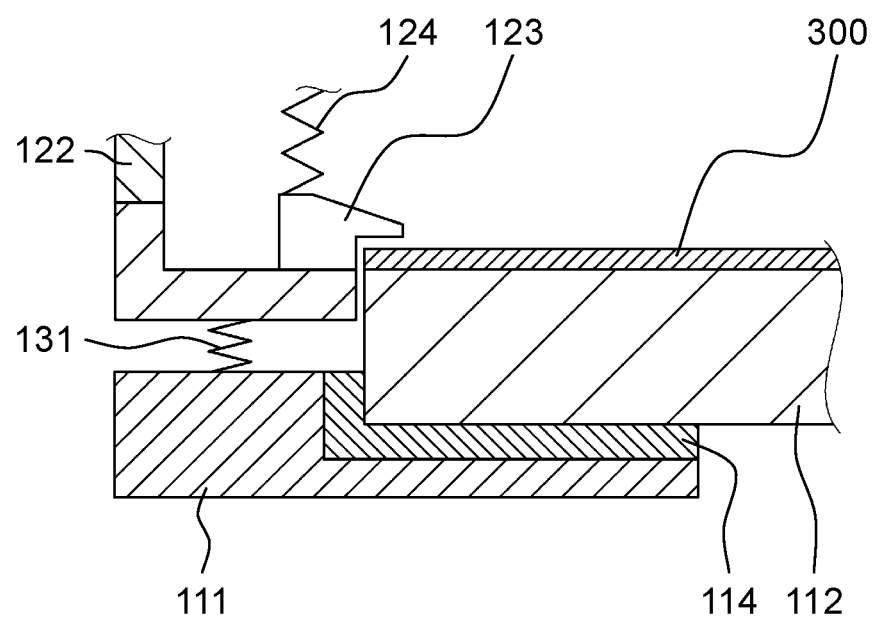
FIG. 3B is a sectional view schematically illustrating a part of the plasma processing apparatus in the vicinity of the guide (in a case where the guide is disposed at a lowered position), according to the second exemplary embodiment of the disclosure.

As illustrated in FIGS. 3A and 3B, a second exemplary embodiment is the same as the first exemplary embodiment except that cover 123 is provided with a protrusion (step) on a surface thereof which is opposite to first main surface 130X of guide 130. In the exemplary embodiment, when the sealed space is formed (FIG. 3B), a part of cover 123 is opposite to the side surface of substrate 300. Therefore, cover 123 mainly regulates the position of substrate 300 in the thickness direction of the substrate and in the direction horizontal to placing surface 112X. Meanwhile, in a case where guide 130 is disposed at the lifted position (that is, a case where lid 120 is disposed at the lifted position), at least a part of guide surface 130Z is closer to the side of lid 120 than placing surface 112X as illustrated in FIG. 3A. Therefore, the accuracy of positioning of substrate 300 is ensured when substrate 300 is placed.

Third Exemplary Embodiment

Figure 4A:
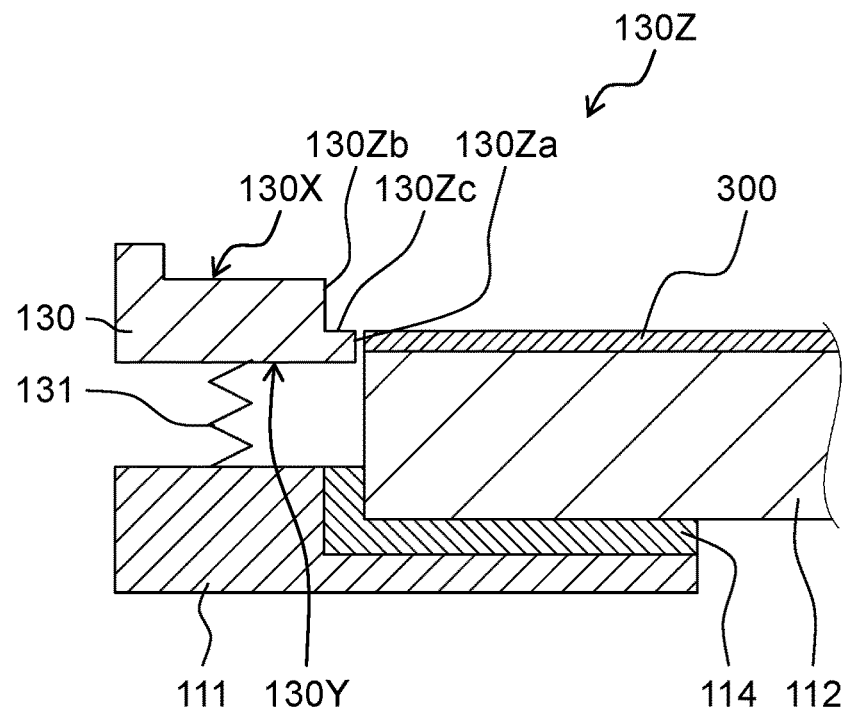
FIG. 4A is a sectional view schematically illustrating a part of a plasma processing apparatus in the vicinity of a guide (in a case where the guide is disposed at a lifted position), according to a third exemplary embodiment of the disclosure.
Figure 4B:
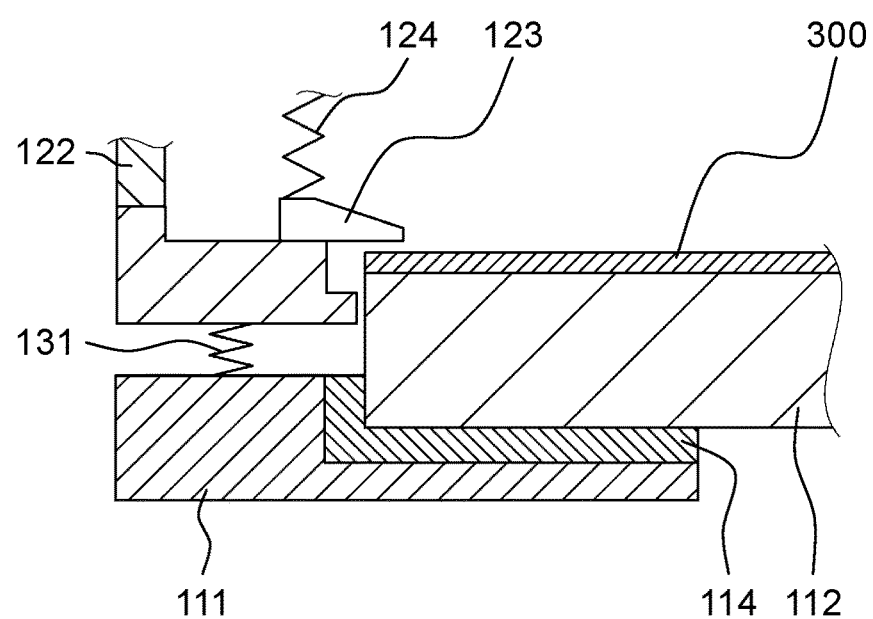
FIG. 4B is a sectional view schematically illustrating a part of the plasma processing apparatus in the vicinity of the guide (in a case where the guide is disposed at a lowered position), according to the third exemplary embodiment of the disclosure.

As illustrated in FIGS. 4A and 4B, a third exemplary embodiment is the same as the first exemplary embodiment except that guide surface 130Z has first guide portion 130Za and second guide portion 130Zb, and a step surface 130Zc is interposed between first guide portion 130Za and second guide portion 130Zb.

First guide portion 130Za extends from one end of step surface 130Zc toward base 110 (pedestal 111), and second guide portion 130Zb extends toward lid 120 from the other end opposite to the end of step surface 130Zc. Second guide portion 130Zb is further apart from the side surface of electrode body 112 than first guide portion 130Za. First guide portion 130Za and second guide portion 130Zb are formed along a normal line to placing surface 112X. In an illustrated example, step surface 130Zc and second main surface 130Y are parallel to each other; however, the surfaces are not limited thereto.

In a case where guide 130 is disposed at the lifted position, at least a part of first guide portion 130Za is closer to the side of lid 120 than placing surface 112X as illustrated in FIG. 4A. Therefore, the accuracy of positioning of substrate 300 is ensured when substrate 300 is placed.

On the other hand, in a case where guide 130 is disposed at the lowered position, at least a part of second guide portion 130Zb is opposite to the side surface of substrate 300 as illustrated in FIG. 4B. Therefore, even in a case where substrate 300 is heated and extends due to plasma, substrate 300 is likely to come into contact with guide 130, and thus damage of cracks or the like is reduced.

Fourth Exemplary Embodiment

Figure 5A:
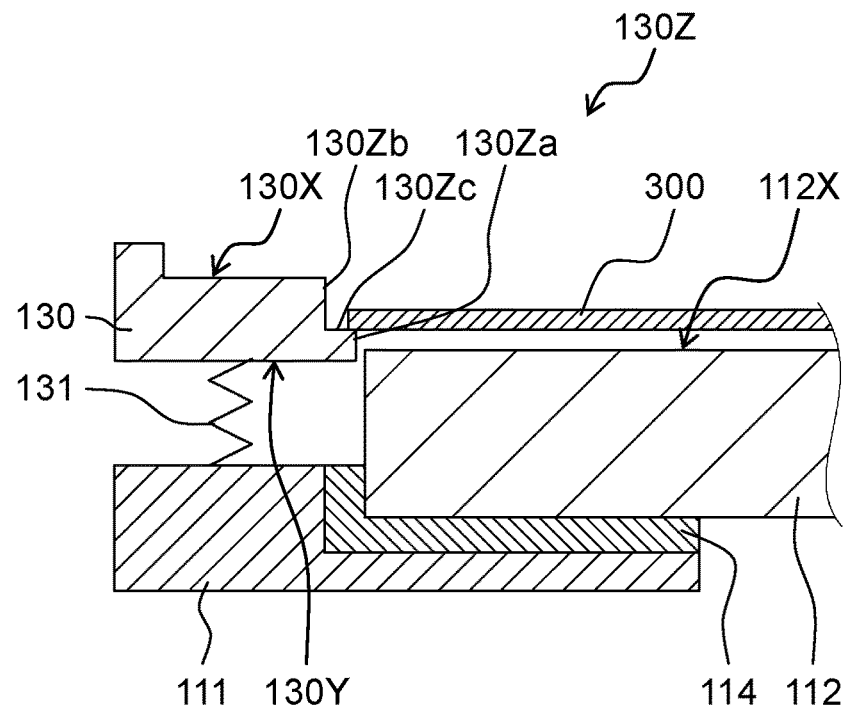
FIG. 5A is a sectional view schematically illustrating a part of a plasma processing apparatus in the vicinity of a guide (in a case where the guide is disposed at a lifted position), according to a fourth exemplary embodiment of the disclosure.
Figure 5B:
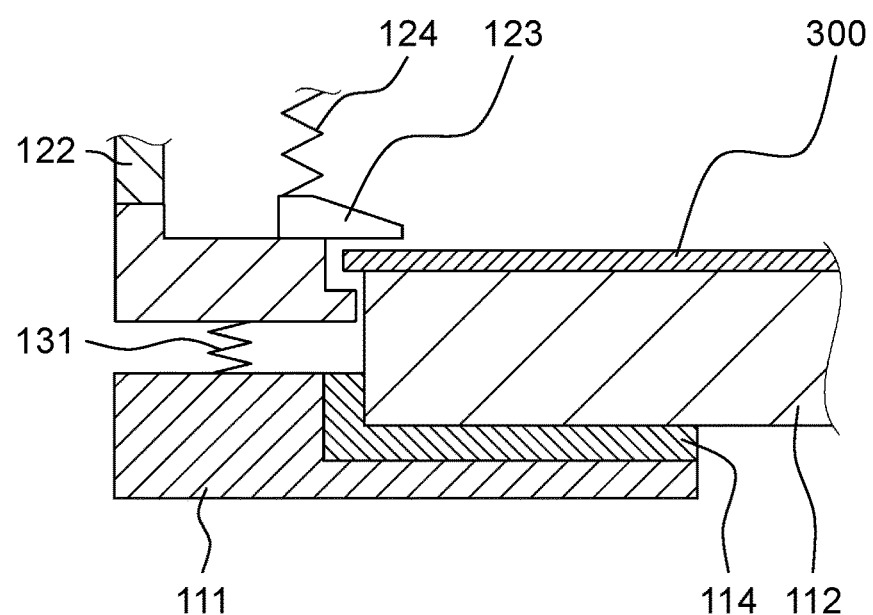
FIG. 5B is a sectional view schematically illustrating a part of the plasma processing apparatus in the vicinity of the guide (in a case where the guide is disposed at a lowered position), according to the fourth exemplary embodiment of the disclosure.

A fourth exemplary embodiment is the same as the third exemplary embodiment except that an area of the main surface of substrate 300 is larger than an area of placing surface 112X (refer to FIGS. 5A and 5B). According to the exemplary embodiment, in a case where guide 130 is disposed at the lifted position, substrate 300 is supported on step surface 130Zc, and at least the outer edge thereof floats to the side of lid 120 as illustrated in FIG. 5A. Accordingly, substrate 300 can be easily separated from placing surface 112X. Further, similar to the third exemplary embodiment, in a case where guide 130 is disposed at the lowered position, at least a part of second guide portion 130Zb is opposite to the side surface substrate 300 as illustrated in FIG. 5B, and thus damage due to the contact between substrate 300 and guide surface 130Z is reduced.

Fifth Exemplary Embodiment

Figure 6A:
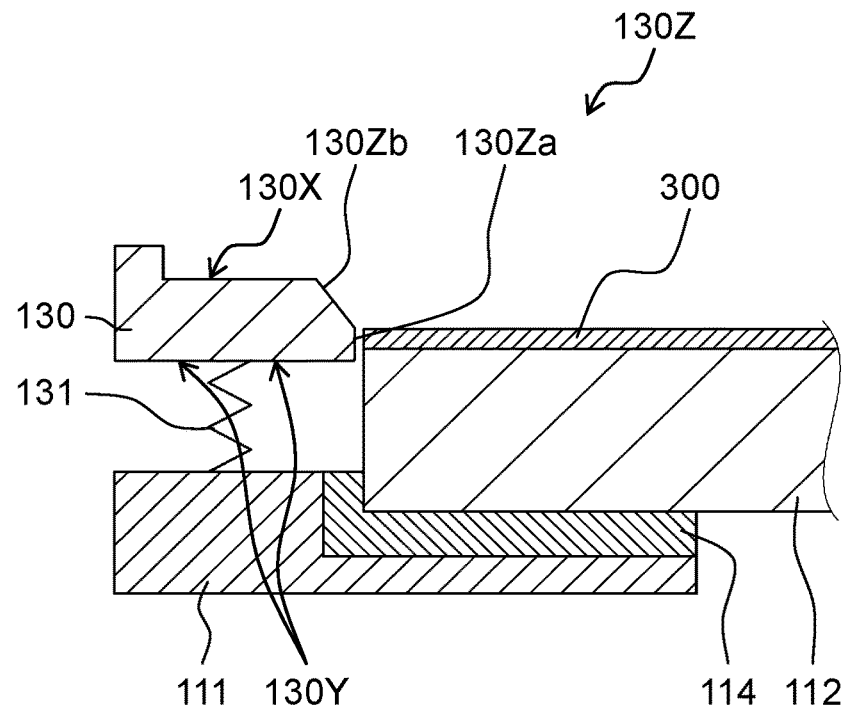
FIG. 6A is a sectional view schematically illustrating a part of a plasma processing apparatus in the vicinity of a guide (in a case where the guide is disposed at a lifted position), according to a fifth exemplary embodiment of the disclosure.
Figure 6B:
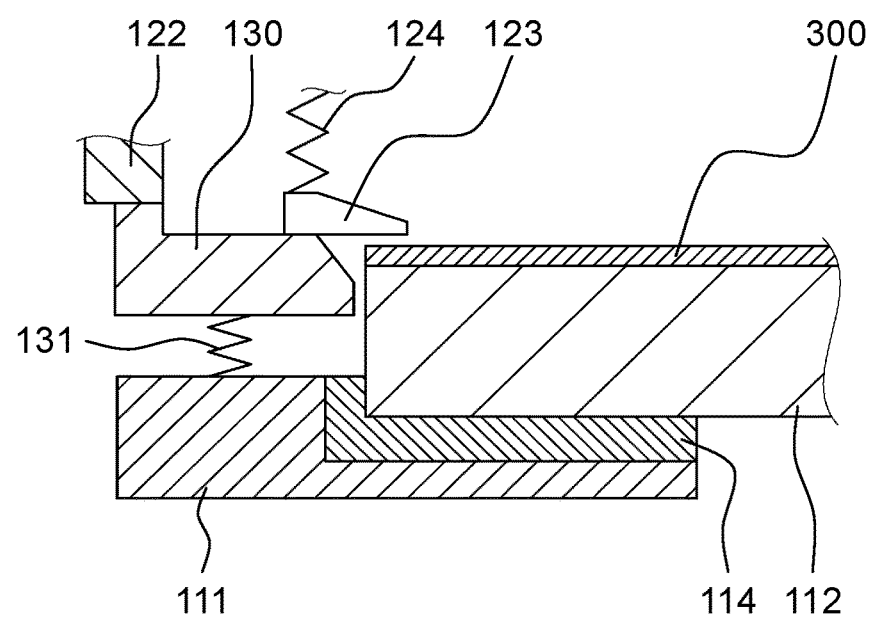
FIG. 6B is a sectional view schematically illustrating a part of the plasma processing apparatus in the vicinity of the guide (in a case where the guide is disposed at a lowered position), according to the fifth exemplary embodiment of the disclosure.

A fifth exemplary embodiment is the same as the first exemplary embodiment except that second guide portion 130Zb inclines from first main surface 130X toward first guide portion 130Za (refer to FIGS. 6A and 6B).

In a case where guide 130 is disposed at the lifted position, at least a part of first guide portion 130Za is closer to the side of lid 120 than placing surface 112X as illustrated in FIG. 6A. Therefore, the accuracy of positioning of substrate 300 is ensured when substrate 300 is placed.

On the other hand, in a case where guide 130 is disposed at the lowered position, at least a part of second guide portion 130Zb is opposite to the side surface of substrate 300 as illustrated in FIG. 6B. Therefore, even in a case where substrate 300 is heated and extends due to the plasma processing, substrate 300 is unlikely to come into contact with guide 130, and thus damage of cracks or the like is reduced. Further, since second guide portion 130Zb inclines toward electrode body 112, a boundary between guide surface 130Z and first main surface 130X on which substrate 300 is first mounted is provided to be sufficiently closer to the outer side than placing surface 112X. Accordingly, even in a case where a separated position of substrate 300 from arm 200 is somewhat shifted from placing surface 112X, it is possible to place substrate 300 at a predetermined position of placing surface 112X with high accuracy.

Sixth Exemplary Embodiment

Figure 7A:
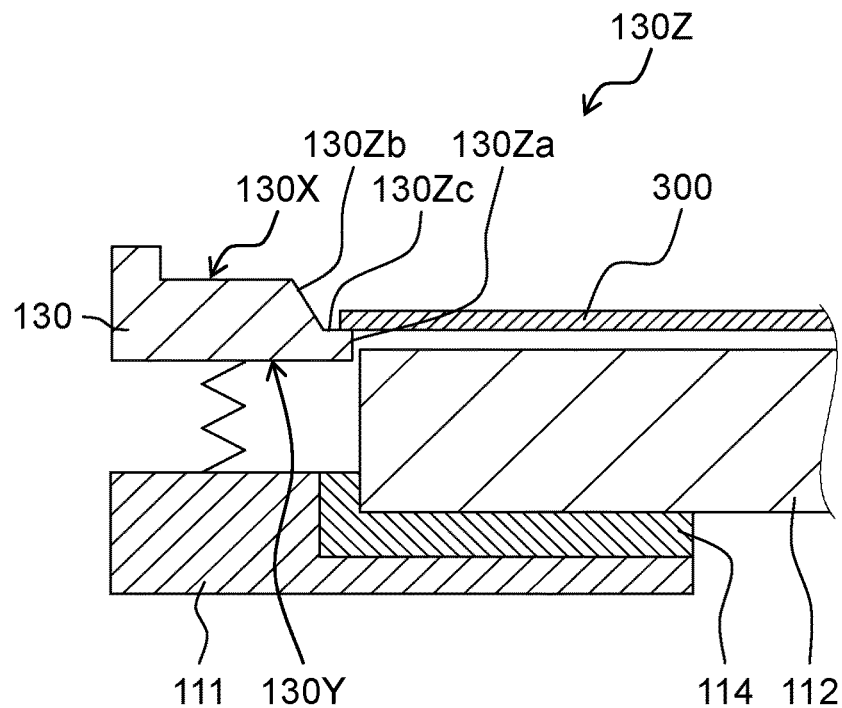
FIG. 7A is a sectional view schematically illustrating a part of a plasma processing apparatus in the vicinity of a guide (in a case where the guide is disposed at a lifted position), according to a sixth exemplary embodiment of the disclosure.
Figure 7B:
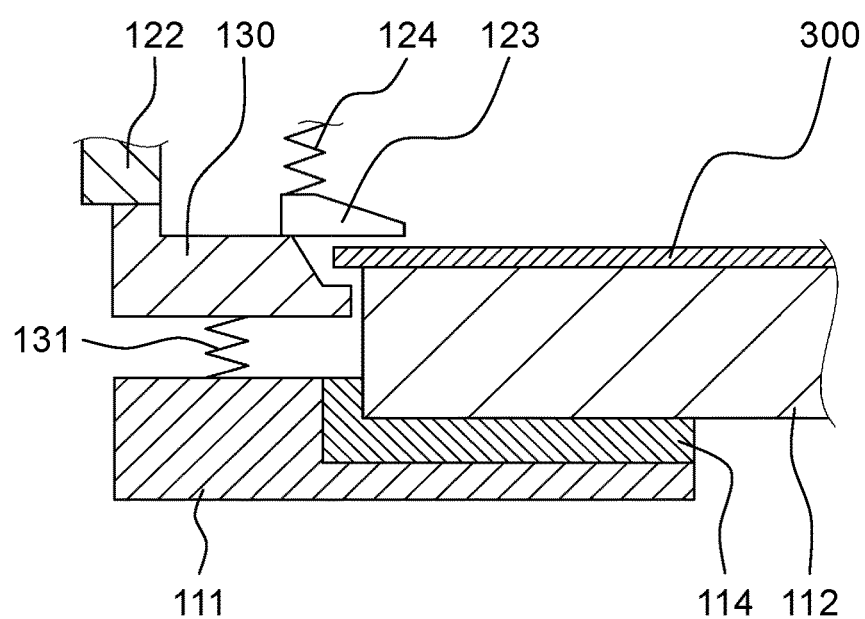
FIG. 7B is a sectional view schematically illustrating a part of the plasma processing apparatus in the vicinity of the guide (in a case where the guide is disposed at a lowered position), according to the sixth exemplary embodiment of the disclosure.

A sixth exemplary embodiment is the same as the fourth exemplary embodiment except that second guide portion 130Zb inclines from first main surface 130X toward first guide portion 130Za (refer to FIGS. 7A and 7B). In other words, guide surface 130Z of the exemplary embodiment includes inclined second guide portion 130Zb and step surface 130Zc.

According to the exemplary embodiment, in a case where guide 130 is disposed at the lifted position, substrate 300 is supported on step surface 130Zc, and at least the outer edge thereof floats to the side of lid 120 as illustrated in FIG. 7A. Accordingly, substrate 300 can be easily separated from placing surface 112X. Further, similar to the second to fourth exemplary embodiments, in a case where guide 130 is disposed at the lowered position, at least a part of second guide portion 130Zb is opposite to the side surface substrate 300 as illustrated in FIG. 7B, and thus damage due to the contact between substrate 300 and guide surface 130Z is reduced. Further, similar to the fifth exemplary embodiment, even in a case where a separated position of substrate 300 from arm 200 is somewhat shifted from placing surface 112X by inclined second guide portion 130Zb, it is possible to place substrate 300 at a predetermined position of placing surface 112X with high accuracy.

Next, a method of performing plasma processing on substrate 300 by using plasma processing apparatus 100 will be described.

The plasma processing method according to the exemplary embodiment includes: a loading step of loading the substrate to a position that is separated from the placing surface and is opposite to the placing surface; a placing step of placing the loaded substrate on the placing surface along the guide that is disposed around the electrode body; and a sealing step of forming the sealed space by lowering the lid after the placing step. In the sealing step, the sealed space is formed, the cover provided integrally with the lid covers at least a part of the outer edge of the substrate placed on the placing surface, and the guide and/or the cover regulates the position of the substrate.

Hereinafter, the plasma processing method will be described in detail with reference to FIGS. 8A to 8C.

First, as illustrated in FIG. 8A, in a state in which the chamber is opened, substrate 300 is loaded into the chamber (loading step). For example, a chuck mechanism using the Bernoulli effect causes substrate 300 to be suctioned to a surface of arm 200 which is opposite to base 110. Substrate 300 is separated from placing surface 112X while being suctioned to arm 200, and the substrate is transported to a position opposite to placing surface 112X. At this time, guide 130 is pressed upward due to the bias force from second biasing part 131 and is disposed at the lifted position.

When substrate 300 is transported to the position opposite to placing surface 112X, arm 200 starts to be lowered. For example, after arm 200 is lowered until the side surface of substrate 300 suctioned to arm 200 is opposite to guide surface 130Z of guide 130, arm 200 stops being lowered.

Subsequently, actuation of the chuck mechanism is stopped, and substrate 300 is separated from arm 200. At this time, substrate 300 falls (falls freely) along guide surface 130Z of guide 130. In this manner, substrate 300 is placed at the predetermined position of placing surface 112X (FIG. 8B). When substrate 300 is separated from arm 200, arm 200 retreats from the chamber.

Figure 8C:
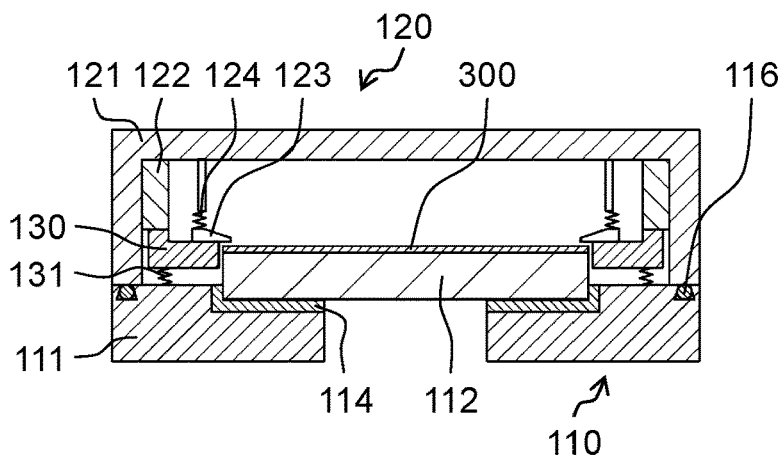
FIG. 8C is a sectional view schematically illustrating the plasma processing apparatus in each of the processes of the plasma processing method according to the exemplary embodiment of the disclosure.

Next, lid 120 is lowered and the chamber is closed (FIG. 8C). At this time, a tip end of linkage 122 provided on lid 120 abuts on guide 130, and guide 130 is pressed downward by being linked to the lowering of lid 120. Further, cover 123 provided on lid 120 is also lowered so as to abut on first main surface 130X of guide 130. In other words, cover 123 covers the outer edge of substrate 300 by being linked to the lowering of lid 120.

At this time, at least on of cover 123 and guide surface 130Z is opposite to the side surface of substrate 300. In this manner, the position of substrate 300 in the directions horizontal and perpendicular to placing surface 112X is regulated. Accordingly, during the plasma processing, it is possible to perform the plasma processing with high accuracy while the outer edge of the substrate is reliably protected with the cover.

Next, the air in the chamber in the sealed state base 110 is evacuated using a suction unit, and the process gas such as argon is introduced into the chamber from a gas supplier installed inside base 110 at when the chamber reaches a predetermined pressure reduction state, for example.

When the chamber has a predetermined pressure, power supply 400 applies high-frequency power between electrode body 112 and lid 120. In this manner, the process gas is turned into plasma in the chamber. As a result, a front surface of substrate 300 is exposed to plasma, and the front surface of substrate 300 is cleaned.

When the cleaning of substrate 300 by plasma is ended, the chamber is opened to the atmosphere, and the pressure reduction state is canceled. Next, when lid 120 is lifted, regulation of the position of substrate 300 by cover 123 in the direction perpendicular to placing surface 112X and a load to guide 130 by linkage 122 are canceled. On the other hand, at least a part of guide surface 130Z protrudes from placing surface 112X toward the side of lid 120. Therefore, regulation of the position of substrate 300 is maintained in the direction horizontal to placing surface 112X. As a result, since the position shift of substrate 300 is reduced, the transport error is unlikely to occur at the time of unloading of the substrate. Subsequently, arm 200 enters the chamber again and causes the chuck mechanism to suction substrate 300. Arm 200 that suctions substrate 300 retreats from the chamber, and a series of plasma processing is ended.

In the exemplary embodiments, a case of cleaning substrate 300 by using plasma processing apparatus 100 is described; however, it is also possible to perform etching in accordance with the method described above in a case where an etching process is performed on substrate 300.

The plasma processing apparatus and the plasma processing method according to the disclosure are used in a case where plasma processing is performed on various types of substrates because the substrate is positioned on an electrode with high accuracy and, further, it is easy to reduce the abnormal discharge.

What is claimed is:

1. A plasma processing apparatus comprising:
   a base that has an electrode body provided with a placing surface on which a substrate is placed and a pedestal which supports the electrode body;
   a lid that is liftable and lowerable with respect to the base and forms a sealed space for performing plasma processing on the substrate placed on the placing surface by being lowered to come into close contact with the pedestal;
   a cover that is connected to the lid and covers at least a part of an outer edge of the substrate placed on the placing surface when the sealed space is formed; and
   a guide that is disposed around the electrode body and is provided with a first main surface which is opposite to the lid, a second main surface which is opposite to the pedestal, and a guide surface which faces a side surface of the electrode body,
   wherein, when the sealed space is formed, the cover abuts on the first main surface and at least one of the cover and the guide surface is opposite to a side surface of the substrate, and
   wherein, when the sealed space is not formed, the cover and the first main surface are separated from each other and at least a part of the guide surface protrudes from the placing surface toward a side of the lid.

2. The plasma processing apparatus of claim 1, further comprising:
   a first biasing part that connects the cover with the lid.

3. The plasma processing apparatus of claim 1, further comprising:
   a second biasing part that is interposed between the guide and the pedestal and enables the guide to be lifted and lowered with respect to the electrode body; and
   a linkage that is provided integrally with the lid and pushes down the guide from a lifted position to a lowered position,
   wherein, when the sealed space is formed, the guide is pushed down to the lowered position by the linkage.

4. The plasma processing apparatus of claim 1,
   wherein the guide surface of the guide includes
   a first guide portion that is positioned on a side of the base, and
   a second guide portion that is positioned on a side of the lid and has a maximum distance from the side surface of the electrode body which is larger than a maximum distance of the first guide portion from the side surface of the electrode body when the sealed space is formed, and
   wherein, when the sealed space is formed, the second guide portion is opposite to the side surface of the substrate.

5. The plasma processing apparatus of claim 4,
   wherein the first guide portion and the second guide portion are disposed with a step surface interposed between the first guide portion and the second guide portion.

6. The plasma processing apparatus of claim 4,
   wherein the second guide portion inclines from the first main surface toward the first guide portion.

7. The plasma processing apparatus of claim 1,
   wherein the cover is a frame-shaped body corresponding to the outer edge of the substrate.

8. The plasma processing apparatus of claim 1,
wherein, when the sealed space is formed, the cover does not come into contact with the substrate.

9. The plasma processing apparatus of claim 2, wherein the first biasing part includes a spring interposed between the cover and lid.

10. A plasma processing method of performing plasma processing using the plasma processing apparatus according to claim 1, the method comprising:
- a loading step of loading the substrate to a position that is separated from the placing surface and is opposite to the placing surface;
- a placing step of placing the loaded substrate on the placing surface along the guide that is disposed around the electrode body; and
- a sealing step of forming the sealed space by lowering the lid after the placing step,
- wherein, in the sealing step,
- at least one of the guide and the cover regulates a position of the substrate.

11. The plasma processing method of claim 10,
wherein a first biasing part connects the cover with the lid.

12. The plasma processing method of claim 10,
wherein a second biasing part that is interposed between the guide and the pedestal enables the guide to be lifted and lowered with respect to the electrode body; and
wherein, when the sealed space is formed, the guide is pushed down to a lowered position by a linkage that is provided integrally with the lid and pushes down the guide from a lifted position to the lowered position.

13. The plasma processing method of claim 10,
wherein the guide surface of the guide includes
a first guide portion that is positioned on a side of the base, and
a second guide portion that is positioned on the side of the lid and has a maximum distance from the side surface of the electrode body which is larger than a maximum distance of the first guide portion from the side surface of the electrode body when the sealed space is formed, and
wherein, when the sealed space is formed, the second guide portion is opposite to the side surface of the substrate.

14. The plasma processing method of claim 13,
wherein the first guide portion and the second guide portion are disposed with a step surface interposed between the first guide portion and the second guide portion.

15. The plasma processing method of claim 13,
wherein the second guide portion inclines from the first main surface toward the first guide portion.

16. The plasma processing method of claim 10,
wherein the cover is a frame-shaped body corresponding to the outer edge of the substrate.

17. The plasma processing method of claim 10,
wherein, when the sealed space is formed, the cover does not come into contact with the substrate.

* * * * *